United States Patent [19]

Turner

[11] 4,236,118
[45] Nov. 25, 1980

[54] STABILIZED REMOTE SENSING HIGH FIDELITY APPARATUS

[76] Inventor: Wheeler M. Turner, 1030 Mission Ridge Rd., Santa Barbara, Calif. 93103

[21] Appl. No.: 970,575

[22] Filed: Dec. 18, 1978

[51] Int. Cl.³ .......................... H03F 1/26; H03F 1/34
[52] U.S. Cl. .................................. 330/105; 179/1 A; 179/1 F; 179/1 P; 330/112; 330/149
[58] Field of Search ............... 330/105, 112, 149, 291, 330/293; 179/1 A, 1 F, 1 P

[56] References Cited

U.S. PATENT DOCUMENTS

| | | | |
|---|---|---|---|
| 2,922,846 | 1/1960 | Humphreys | 179/1 F |
| 3,493,682 | 2/1970 | Erath | 179/1 F |
| 3,525,812 | 8/1970 | Verdier | 330/105 X |
| 3,838,352 | 9/1974 | Dolby et al. | 330/149 X |
| 4,092,494 | 5/1978 | Micheron | 179/1 F |

FOREIGN PATENT DOCUMENTS 659066 10/1951 United Kingdom ................... 179/1 F
877921 9/1961 United Kingdom ................... 330/291

Primary Examiner—James B. Mullins
Attorney, Agent, or Firm—Smyth, Pavitt, Siegemund, Jones & Martella

[57] ABSTRACT

In a high-fidelity sound reproducing system wherein the speaker is located remotely from the amplifier and therefore the electrical signals reaching the speaker are subject to distortion from the capacitive and inductive reactance of the conductors joining the amplifier to the speaker, and further subject to pickup of hum and other forms of interference, the distortion of the signal is substantially eliminated by the use of a negative feedback network connected between the input terminal of the load and the input terminal of the amplifier and by a positive feedback network connected between the input terminal of the amplifier and the return terminal of the load, the feedback loops operating on the amplifier to alter its output in such a way that the signal applied at the terminals of the remote speaker more nearly resembles the signal applied as an output to the amplifier.

11 Claims, 3 Drawing Figures

STABILIZED REMOTE SENSING HIGH FIDELITY APPARATUS

BACKGROUND OF THE INVENTION

1. Field of the Invention

The present invention is in the field of high-fidelity audio systems and specifically relates to apparatus for cancelling spurious signals which might appear on the conductors connecting the power amplifier to a remotely-located speaker system.

2. The Prior Art

In prior art high fidelity sound producing or reproducing systems a nearly perfectly amplified representation of an audio input signal is generated at the power amplifier output terminals. However, modern loudspeaker systems frequently present a very complex load condition to the amplifier through speaker wires and connectors of finite resistance and impedance. These complex load conditions result from the variations in phase angle and impedance components of resistance, capacitance and inductance with frequency and amplitude changes. Many high fidelity speaker systems employ very complex cross-over networks between the various transducers with the result that spurious signals may be applied to all of the transducers. It should be noted that were the impedance seen by the speaker at its terminal zero in magnitude no spurious signal could be developed. Also, loudspeaker wires as normally employed in prior art high fidelity sound systems are not capable of delivering a perfect reproduction of an amplifier output signal to even a perfectly resistive load (which is practically never encountered) by reason of the capacitive and inductive reactance properties of such interconnecting wires or cables.

SUMMARY OF THE INVENTION

The present invention consists of a high fidelity audio amplifier, loudspeaker means, appropriate interconnecting wires, and means for returning wires to the amplifier so as to effectively electrically sense amplified signal voltages at the speaker terminals which may be remotely located away from the amplifier means. The remotely sensing wires returning to the amplifier means are connected in such a manner as to constitute both a negative feedback path from one loudspeaker terminal and an error cancelling positive feedback path from the other loudspeaker terminal so as to effectively electrically remove from system operation any and all spurious signals which normally appear across the loudspeaker and amplifier interconnecting wires.

It is an object of the present invention to effectively eliminate the effects of the signal carrying wire which is normally connected between an audio power amplifier and a loudspeaker by applying a substantial portion of negative feedback around both the power amplifier (or a part thereof) and said interconnecting wire. It is a further object of the present invention to effectively eliminate the effects of the ground, or speaker return, wire by means of applying a carefully apportioned fraction of signals appearing at the speaker end of said return wire in a positive feedback relationship around the power amplifier or a portion thereof.

It is a further object of the present invention to place a filter network in the amplifier to cause a condition of electrical stability to exist under all reasonably expected conditions of operation. For instance, should the impedence of the speaker or other load be of a value, at any frequency within the pass band of the amplifier, of less than the impedance value of the said ground return wire, then instability will manifest under the conditions represented by the aforementioned positive feedback loop.

It is a further object of the present invention to prevent spurious signals generated by any one transducer in a multispeaker sound system from being applied to other transducers constituting parts of the sound system. For instance, should a signal which is in the nature of a transient containing both high and low frequency components be applied to a so called two-way speaker system of nominal four ohms impedence through interconnecting wires of, say 0.25 ohms total loop impedence, then any spurious vibrations of a higher frequency nature generated by the low frequency transducer will appear attenuated to a nominal 6% across the terminals of the higher frequency transducer with an attendant gross reduction in fidelity as compared with the original amplifier input signal or with the signal present at the amplifier output device terminals.

It is a further object of the present invention to substantially effectively eliminate signal degradation present at the speaker terminals caused by imperfect connectors, relay contacts and the like which are normally interposed between audio power amplifier output devices and the speaker terminals.

It is a further object of the present invention to eliminate from all speakers in a multispeaker arrangement spurious signals caused by the energy storage characteristic of the various elements such as capacitors and inductors which are normally employed as frequency sensitive cross-over networks as between the various transducers and which are frequently employed as time or phase correcting means.

It is a further object of the present invention to permit the use of longer than normal or smaller than normal wires as interconnections between an audio power amplifier and its associated loudspeakers. By normal is meant those values which would be determined by those skilled in the art as exhibiting maximum values of impedence allowable before excessive degradation of sound quality is encountered.

For the purpose of clarifying the nature of the present invention an exemplary embodiment is illustrated in accompanying figures.

DESCRIPTION OF THE PREFERRED EMBODIMENT

Figure 1:
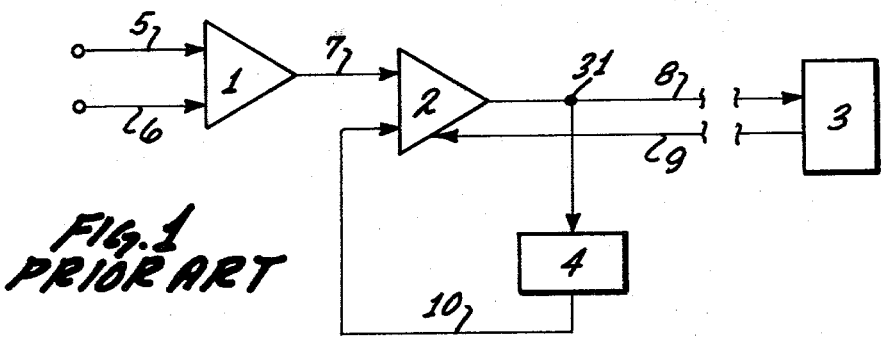
FIG. 1 is a block diagram of a typical audio amplifier with a loudspeaker load attached thereto.

As illustrated in the block diagram of FIG. 1, an input signal is applied by means of wire 5 and return wire 6 to input amplifier 1 which in this example has a voltage gain of one with a high input impedance and a low output impedance so as to act as a signal buffer or isolator. Wire 7 conveys the signal to power and voltage amplifier 2 with wire 8 connecting the output to remote speaker load 3. Wire 9 serves as a return path to amplifier 2. In conventional amplifiers such as this one indicated, a negative feedback network 4 serves to stabilize the amplifier and causes it to exhibit a very low impedance at the point at which said network 4 is connected. Problems with such prior art amplifiers occur because of the impedances encountered between said feedback connection point 31 and the loudspeaker caused by amplifier wiring, output relays, switches, connectors and the like. Problems also occur along the path of the speaker return signal due to many of the above cited reasons before such return signals terminate at the desired point of connection within the power amplifier (usually designated ground). For further descriptions of the present invention said return paths, wires and points will be referred to, only for convenience, as ground.

Figure 2:
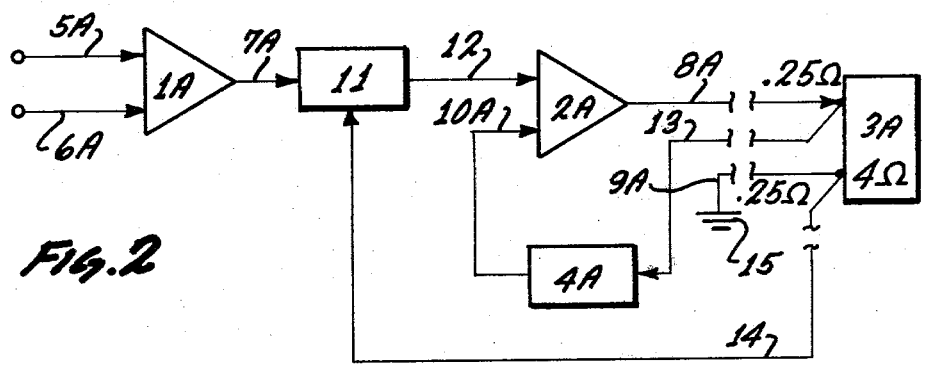
FIG. 2 is a block diagram of an amplifier which may be similar to that of FIG. 1 but with the additional elements of this invention indicated.

In the exemplary block diagram of the present invention, FIG. 2, input signal wire 5A and ground wire 6A convey the signal to gain of one input buffer amplifier 1A which presents a very low output impedance through wire 7A to ground return positive feedback summing network 11. Wire 12 conveys the modified signal to power and voltage amplifier 2A. Wire 8A conveys the power amplifier output signal to speaker (or other) load 3A with the power return being along wire 9A. Note, however, that additional wire 13 conveys the negative feedback signal to negative feedback network 4A with wire 10A completing the path to the proper feedback input terminal of amplifier 2A. Additionally, wire 14 conveys any signal present at the ground return point of load 3A to summing network 11.

For this description amplifier 2A will be assumed to be ideal with infinite open loop voltage gain and zero output impedance with flat frequency response and no time or phase delays or aberrations. Further, for convenience only but not intended to be limiting in any way, values will be assigned to other parameters of FIG. 2.

Let the resistance of the path between the amplifier 2A output circuit point through any switches, relays and the like and through wire 8A be 0.25 ohms, the nominal impedance of speaker load 3A be 4 ohms and ground path 9A be 0.25 ohms. It is evident that the entire circuit from the amplifier output circuit point is 4.5 ohms with the speaker "seeing" a 0.5 ohm source. One effect of this is to limit the damping factor of the speaker to eight in spite of the fact that the amplifier itself has been described as perfect with zero ohms output impedance. Further, to typify the circuit of FIG. 2, let network 4A cause the amplifier 2A to exhibit a voltage gain of 20 times. In this invention positive feedback summing network 11 might add, typically, 1/20th of any signal appearing at the ground return point of load 3A through wire 14 to the signal appearing at the output of buffer amplifier 1A by way of wire 12 to the normal signal input terminal of amplifier 2A. Treating only of the fact that remote sensing of the amplifier signal output at the remote load location 3A and from there, after encountering the aforementioned 0.25 ohm aggregate impedance, it is evident that the zero impedence point has been moved from the amplifier output circuit terminal to the remote input point of load 3A. At this point in this description the path impedance is 4.25 ohms and the damping factor has been increased to 16. Further, it is evident that 89% of any signal applied will appear across load 3A and 11% will appear across return wire 9A. If the amplifier output is designated as 1 volt then the following conditions apply at this point in the progress of this description:

The input voltage to amplifier 2A is 0.05 volts, the output is 1 volt appearing between the input of remote load 3A and ground reference located at amplifier 2A. 0.9412 volts appears across load 3A and 0.0588 volts across ground return load 9A. The same 0.0588 volts above described is conveyed by wire 14, the summing network 11 and because of the aforementioned division by 20 in summing network 11 causes the input to amplifire 2A to increase from 0.05 volts to 0.0529 volts, the output of amplifier 2A changes to 1.0588 volts resulting in a signal across the load of 0.9965 volts. By employing the well known formula: Gain$=A/(1-A\beta)$ where A equals the gain of the amplifier and $\beta$ equals the fraction of the output voltage fedback, it is easily shown that the signal across load 3A approaches 1 volt. By the foregoing, a comparison of the conventional amplifier of FIG. 1 and the herein described inventive amplifier FIG. 2 discloses that a conventional amplifier operating under the arbitrary conditions of this description will differ in output at the load by 11%. All of said difference is an error on the part of the conventional amplifier or, in other words, an error of 11% has been substantially completely corrected by the modus of this invention.

Figure 3:
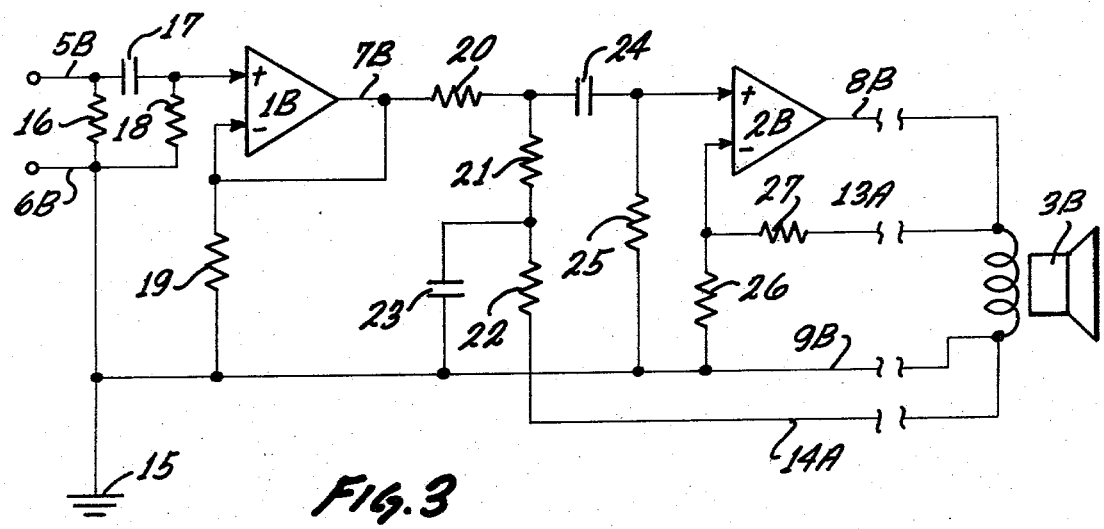
FIG. 3 is a schematic diagram describing one illustrative embodiment of the present invention.

Some loudspeaker systems and more particularly those of the electrostatic type are capable of presenting a capacitively reactive load to an audio amplifier which capacitive reactance can under some circumstances so load the amplifier so as to cause electrical instability which frequently results in damage to either the amplifier or loudspeaker or both. In the present invention such instabilities occur when said reactive impedance reaches a value equal to less than the impedance of ground return wire 9A. In the present invention such instability is precluded by causing the positive feedback function to diminish in magnitude gradually as a function of increasing frequency and having its break, or 3 db, point set at such value as will cause such diminution of positive feedback to substantially track the decreasing load impedance resulting from said reactive load. It is contemplated that most embodiments of this invention would contain such stabilizing diminution of positive feedback. FIG. 3 illustrates in electrical schematic for one specific example of the invention with typical component values (but not limiting same) listed following hereinunder. FIG. 3 will not be described in detail herein because FIG. 2 as described above covers the essence of the invention and all circuit portions illustrated in FIG. 2 take entirely conventional electrical schematic form as illustrated in FIG. 3. Suffice it to say that resistors 27 and 26 set the gain of the amplifier through negative feedback action and that resistors 20 and 25 with resistors 21 and 22 along with capacitor 24 comprise the properly apportioned positive feedback network. Capacitor 23 acts to diminish positive feedback in such a manner as to assure electrical stability under any reasonable operating conditions.

A representative listing of circuit component values shown in FIG. 3 is:
16—470,000 ohms
17—1.0 microfarad
18—47,000 ohms
19—47,000 ohms
20—1,000 ohms
21—15,000 ohms
22—3,200 ohms
23—0.0015 microfarads
24—1.0 microfarad
25—10,000 ohms
26—10,000 ohms
27—200,000 ohms It should be understood that the figures and the specific descriptions thereof set forth in this application are for the purpose of illustrating the present invention and are not to be construed as limiting the present invention to the precise and detailed structure shown in the figures and specifically described hereinbefore. Rather, the real invention is intended to include substantially equivalent constructions embodying the basic teachings and inventive concepts of the present invention.

What is claimed is:

1. An improved amplifier system for driving a remotely located load wherein it is desired that the amplified signal applied to the load be a high-fidelity reproduction of an input signal, said system comprising:
    a load remotely located from the amplifier system and having an input terminal and a return terminal;
    an amplifier having an input terminal, and having an output terminal connected to the input terminal of the load, and having a return terminal connected to the return terminal of the load;
    a negative feedback network connected between the input terminal of the load and the input terminal of the amplifier, and applying to the input terminal of the amplifier a negative feedback signal related to the difference between the signal present at the input terminal of the load and a high fidelity reproduction of the input signal.

2. The system of claim 1 wherein said negative feedback network is located adjacent said amplifier.

3. The system of claim 1 further comprising means for altering said negative feedback network to control the amount of negative feedback applied to said amplifier.

4. An improved amplifier system for driving a remotely located load wherein it is desired that the amplified signal applied to the load be a high-fidelity reproduction of an input signal said system comprising:
    a load remotely located from the amplifier system and having an input terminal and a return terminal;
    an amplifier having an input terminal, and having an output terminal connected to the input terminal of the load, and having a return terminal connected to the return terminal of the load;
    a positive feedback network connected between the input terminal of the amplifier and the return terminal of the load, and applying to the input terminal of the amplifier a positive feedback signal related to the difference between the signal present at the input terminal of the load and a high fidelity reproduction of the input signal.

5. The system of claim 4 wherein said positive feedback network is located adjacent said amplifier.

6. The system of claim 4 further comprising means for altering said positive feedback network to control the amount of positive feedback applied to said amplifier.

7. An improved amplifier system for driving a remotely located load wherein it is desired that the amplified signal applied to the load be a high-fidelity reproduction of an input signal, said system comprising:
    a load remotely located from the amplifier system and having an input terminal and a return terminal;
    an amplifier having an input terminal, and having an output terminal connected to the input terminal of the load, and having a return terminal connected to the return terminal of the load;
    a negative feedback network connected between the input terminal of the load and the input terminal of the amplifier and applying to the input terminal of the amplifier a negative feedback signal related to the difference between the signal present at the input terminal of the load and a high fidelity reproduction of the input signal; and
    a positive feedback network connected between the input terminal of the amplifier and the return terminal of the load, and applying to the input terminal of the amplifier a positive feedback signal related to the difference between the signal present at the input terminal of the load and a high fidelity reproduction of the input signal.

8. The system of claim 7 wherein said negative feedback network and said positive feedback network are located adjacent said amplifier.

9. The system of claim 7 further comprising means for altering said negative feedback network to control the amount of negative feedback applied to said amplifier, and further comprising means for altering said positive feedback network to control the amount of positive feedback applied to said amplifier.

10. In a system of the type in which a power amplifier is connected by a lead and a return conductor to a distant load and in which it is desired that the signal applied by the lead to the distant load be a high-fidelity reproduction of an input signal applied to the power amplifier, the improvement comprising:
    a negative feedback network connected between the input of the power amplifier and the point at which the lead is connected to the distant load, and applying to the input of the power amplifier feedback signals related to the difference between the signal applied by the lead to the load and a high-fidelity reproduction of the input signal.

11. In a system of the type in which a power amplifier is connected by a lead and a return conductor to a distant load and in which it is desired that the signal applied by the lead to the distant load be a high-fidelity reproduction of an input signal applied to the power amplifier, the improvement comprising:
    a positive feedback network connected between the input of the power amplifier and the point at which the return conductor is connected to the distant load, and applying to the input of the power amplifier feedback signals related to the signal at the point where the return conductor is connected to the load and to the input signal.

* * * * *